(12) United States Patent
Wang et al.

(10) Patent No.: US 10,453,962 B2
(45) Date of Patent: Oct. 22, 2019

(54) FINFET DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Nan Wang, Shanghai (CN); Zi Cheng Pan, Shanghai (CN); Zhong Shan Hong, Shanghai (CN)

(73) Assignees: Semiconductor Manufacturing International (Shanghai) Corporation, Shanghai (CN); Semiconductor Manufacturing International (Beijing) Corporation, Bejing (CN)

( * ) Notice: Subject to any disclaimer, the term of this patent is extended or adjusted under 35 U.S.C. 154(b) by 0 days.

(21) Appl. No.: 15/971,144

(22) Filed: May 4, 2018

(65) Prior Publication Data
US 2018/0323300 A1 Nov. 8, 2018

(30) Foreign Application Priority Data
May 5, 2017 (CN) .......................... 2007 1 0310992

(51) Int. Cl.
*H01L 21/00* (2006.01)
*H01L 29/00* (2006.01)
(Continued)

(52) U.S. Cl.
CPC ........ *H01L 29/785* (2013.01); *H01L 21/2253* (2013.01); *H01L 21/823431* (2013.01);
(Continued)

(58) Field of Classification Search
CPC ........... H01L 21/2253; H01L 21/28088; H01L 21/823431; H01L 29/785; H01L 29/6681;
(Continued)

(56) References Cited

U.S. PATENT DOCUMENTS 8,692,320 B2 * 4/2014 Gibbons ......... H01L 21/823425
257/330
8,723,236 B2 * 5/2014 Liu ................... H01L 29/66795
257/288

(Continued)

*Primary Examiner* — Nikolay K Yushin
(74) *Attorney, Agent, or Firm* — Anova Law Group, PLLC

(57) ABSTRACT

A FinFET device and fabrication method thereof is provided. The method includes: providing a semiconductor substrate and fins. Each fin includes a first sidewall region and a second sidewall region. An interlayer dielectric layer is formed on the semiconductor substrate and on the fins, with openings. Then a target work function layer is formed on sidewalls and on a bottom of each opening. The target work function layer includes a first target region covering the first sidewall region, a second target region covering the second sidewall region, and a third portion on the top surface of each fin. The second target region and the third portion of the target work function layer is doped with modification ions; and has a second effective work function value greater than a first effective work function value of the first target region of the target work function layer.

19 Claims, 4 Drawing Sheets

(51) Int. Cl.
    *H01L 29/78*       (2006.01)
    *H01L 29/66*       (2006.01)
    *H01L 21/225*     (2006.01)
    *H01L 29/423*     (2006.01)
    *H01L 21/8234*    (2006.01)
    *H01L 29/06*       (2006.01)

(52) U.S. Cl.
    CPC ...... *H01L 29/0649* (2013.01); *H01L 29/4232* (2013.01); *H01L 29/6681* (2013.01)

(58) Field of Classification Search
    CPC ........... H01L 29/4232; H01L 29/66545; H01L 29/0649; H01L 29/4966
    See application file for complete search history.

(56) References Cited

U.S. PATENT DOCUMENTS

2012/0061751 A1* 3/2012 Gibbons ......... H01L 21/823425
                                                           257/330
2013/0092984 A1* 4/2013 Liu .................. H01L 29/66795
                                                           257/288
2014/0103437 A1* 4/2014 Kapoor ................ H01L 29/785
                                                           257/347

\* cited by examiner

FINFET DEVICE AND FABRICATION METHOD THEREOF

CROSS-REFERENCES TO RELATED APPLICATION

This application claims the priority of Chinese Patent Application No. 201710310992.1, filed on May 5, 2017, the content of which is incorporated herein by reference in its entirety.

TECHNICAL FIELD

The present disclosure generally relates to the field of semiconductor technologies and, more particularly, relates to a fin field effect transistor (FinFET) device and its fabrication method.

BACKGROUND

A metal-oxide-semiconductor (MOS) transistor is one of the most important devices in modern integrated circuits. A MOS transistor usually includes a semiconductor substrate, gate structures on a surface of the semiconductor substrate, and source/drain regions in the semiconductor substrate on both sides of each gate structure. Each gate structure further includes a gate dielectric layer on the surface of the semiconductor substrate and a gate electrode layer on a surface of the gate dielectric layer.

With continuous developments of the semiconductor technology, the conventional planar CMOS transistors have a worse controlling ability on the channel current, inducing serious leakage current problems. A fin field effect transistor (FinFET) is one emerging multi-gate device. A typical structure of a FinFET usually includes fins protruding from the semiconductor substrate, gate structures covering a portion of top surfaces and sidewalls of the fins, and source/drain regions in the fins on both sides of each gate structure.

However, the performance of conventionally fabricated FinFET devices still needs to be improved. The disclosed devices and methods are directed to at least partially alleviate one or more problems set forth above and to solve other problems in the art.

SUMMARY

One aspect of the present disclosure provides a fabrication method for forming a FinFET. The method includes: providing a semiconductor substrate and fins on the semiconductor substrate. Each fin includes a first sidewall region and a second sidewall region above the first sidewall region. An interlayer dielectric layer is formed on the semiconductor substrate and on the fins, with openings in the interlayer dielectric layer to expose a portion of sidewalls and a portion of a top surface of each fin. A target work function layer is formed on sidewalls and on a bottom of each opening. The target work function layer includes a first target region covering the first sidewall region, a second target region covering the second sidewall region, and a third portion on the top surface of each fin. The second target region and the third portion of the target work function layer is doped with modification ions. The first target region of the target work function layer has a first effective work function value, while the second target region and the third portion of the target work function layer has a second effective work function value greater than the first effective work function value.

Another aspect of the present disclosure provides a FinFET. The FinFET includes: a semiconductor substrate and fins on the semiconductor substrate. Each fin has a first sidewall region and a second sidewall region above the first sidewall region. The FinFET also includes an interlayer dielectric layer on the semiconductor substrate and on the fins. The interlayer dielectric layer contains openings to expose a portion of the sidewalls and a portion of the top surface of each fin. A target work function layer is on sidewalls and a bottom of each opening. The target work function layer includes a first target region covering the first sidewall region, a second target region covering the second sidewall region, and a third portion on the top surface of each fin. The second target region and the third portion of the target work function layer is doped with modification ions. The first target region of the target work function layer has a first effective work function value, while the second target region and the third portion of the target work function layer has a second effective work function value greater than the first effective work function value.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
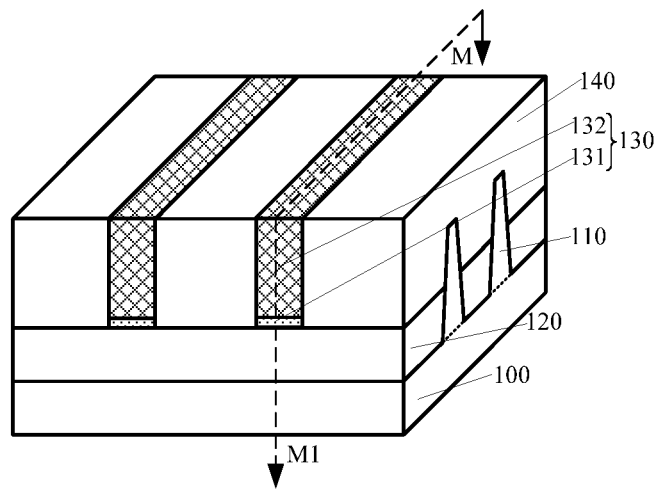
FIG. 1 to FIG. 9 illustrate semiconductor structures corresponding to certain stages for forming an exemplary fin field effect transistor (FinFET) device according to various disclosed embodiments of present disclosure.

Reference will now be made in detail to exemplary embodiments of the disclosure, which are illustrated in the accompanying drawings. Wherever possible, the same reference numbers will be used throughout the drawings to refer to the same or like parts.

A fin field effect transistor (FinFET) device may be formed by: providing fins protruding from a semiconductor substrate; forming an interlayer dielectric layer on the semiconductor substrate and on the fins, the interlayer dielectric layer containing openings to expose a portion of top surfaces and a portion of sidewalls of the fins; forming a work function layer on a bottom and sidewalls of each opening; and forming a gate electrode layer on the work function layer in each opening.

Each fin has a bottom width larger than a top width because of the process for forming fins. The bottom width and top width of each fin is a size in a direction parallel to the semiconductor substrate and perpendicular to the extending direction of the fins. In a middle and bottom region of each fin, the ratio of a depth of a depletion layer from the sidewall surface to the inside fin, the depth being in a direction parallel to the fin width, over the fin width is small. Correspondingly, in the middle and bottom region of each fin in the off state, the channel may have a large number of mobile carriers, and leakage currents in the off state of the FinFETs mainly occur in the bottom region of the fin.

To reduce the leakage current in the off state of the FinFET, the work function layer with a small effective work function value may be used to make the middle/bottom region of each fin have a bigger turn-on voltage and hard to turn on. However, the work function layer with a small effective work function value may also increase the turn-on voltage of the middle/top region of each fin. Moreover, the driving current of the FinFET mainly depends on the turn-on voltage of the middle/top region of each fin. As the driving voltage remains unchanged, the greater the turn-on voltage of the middle/top region of each fin, the less the driving current can be. This may lead to a reduced driving current of the FinFET. However, it is hard to simultaneously reduce the leakage current in the off state and to improve the driving current of the FinFET.

The present disclosure provides a FinFET device and fabricating method. The fabrication method may include: forming a target work function layer including a first target region covering a first sidewall region of each fin and a second target region covering a second sidewall region of a same fin. The first target region of the target work function layer may have a first effective work function value. The second target region and a portion of the target work function layer on the top surface of the fins may be doped with modification ions and may have a second effective work function value. The second effective work function value may be larger than the first effective work function. As such, the turn-on voltage of the middle/bottom region of each fin may be increased and the leakage current in off states of the FinFET may be reduced. Simultaneously, the turn-on voltage of the middle/top region of each fin may be reduced and the driving current of the FinFET may be increased. Correspondingly, the performance of the FinFET may be improved.

FIG. 1 to FIG. 9 illustrate semiconductor structures corresponding to certain stages for forming an exemplary FinFET device according to various disclosed embodiments of present disclosure. FIG. 10 illustrates an exemplary method for forming a FinFET device according to various disclosed embodiments.

Figure 2:
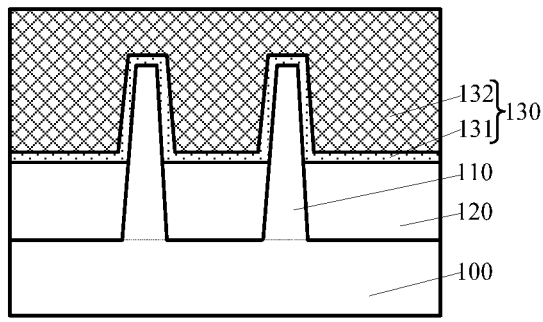

As illustrated in FIG. 1 and FIG. 2, a semiconductor substrate 100 and discrete fins 110 protruding from the semiconductor substrate 101 may be provided (e.g., in Step S802 in FIG. 10). FIG. 1 illustrates a three-dimensional structure for forming the disclosed device, and FIG. 2 is the cross-sectional view of the structure along the M-M1 direction in FIG. 1. The semiconductor substrate 100 may provide a platform for subsequently forming the FinFET device.

In various embodiments, the semiconductor substrate 100 may be made of single crystalline silicon (Si), polysilicon, amorphous silicon, germanium (Ge), silicon germanium (SiGe), silicon carbide (SiC), gallium arsenide (GaAs), and/or indium gallium (InGa).

In one embodiment, the fins 110 may be formed by patterning the semiconductor substrate 100. In other embodiments, the fins 110 may be formed by forming a fin material layer on the semiconductor substrate and patterning the fin material layer to form the fins.

A sidewall of each fin 110 may include a first sidewall region and a second sidewall region above the first sidewall region.

In one embodiment, the ratio between sizes of the first sidewall regions and the second sidewall regions in a direction parallel to the sidewalls of the fins 110 and perpendicular to the extending direction of the fins 110 may be about 2:5 to about 3:5.

In one embodiment, a bottom width of each fin 110 may be larger than a top width of each fin 110, generated because of the etching process for forming fins. Each of the bottom width and top width of each fin is a size in a direction parallel to a surface of the semiconductor substrate 100 and perpendicular to the extending direction of each fin 110.

An isolation layer 120 may be formed on the semiconductor substrate 100, and the isolation structure 120 may cover a portion of sidewalls of each fin 110. The isolation structure 120 may have a top surface lower than the top surfaces of the fins 110.

For example, the isolation structure 120 may be made of $SiO_2$, or any suitable materials As illustrated in FIG. 1 and FIG. 2, dummy gate structures 130 may be formed on the semiconductor substrate 100 and on the fins 110 subsequently. After forming the dummy gate structures 130, an interlayer dielectric layer 140 may be formed on the semiconductor substrate 100 and on the fins 110 (e.g., in Step S804 in FIG. 10). The interlayer dielectric layer 140 may cover sidewalls of the dummy gate structures 130 and expose top surfaces of the dummy gate structures 130.

In one embodiment, before forming the interlayer dielectric layer 140, source/drain doped regions may be formed in each fin 110 on both sides of the dummy gate structures 130. Correspondingly, the source/drain regions may be located on two sides of gate structures after subsequent formation of the gate structures.

The dummy gate structures 130 may cross the fins 110 and cover a portion of the top surfaces and a portion of the sidewalls of the fins. The dummy gate structures 130 may also be formed on the isolation structure 120.

Each dummy gate structure 130 may include a dummy gate dielectric layer 131 and a dummy gate electrode layer 132 on the dummy gate dielectric layer 131. The dummy gate dielectric layers 131 may cross the fins 110. The dummy gate dielectric layers 131 may further be formed on a portion of the surface of the isolation structure 120 and cover a portion of the top surfaces and a portion of the sidewalls of the fins 110.

In one embodiment, the dummy gate electrode layers 132 may be made of polysilicon.

In one embodiment, only the dummy gate electrode layers 132 may be removed to form openings and the dummy gate dielectric layers 131 may be used to form a gate dielectric layer. For example, the dummy gate dielectric layers 131 may be made of high-K materials with K>3.9.

In other embodiments, the dummy gate structures 132 may be totally removed to form the opening, and the dummy gate dielectric layers 131 may be made of $SiO_2$.

Removing the dummy gate structures 130 to form the opening will be illustrated as an example in the following description.

The interlayer dielectric layer 140 may be made of low-K dielectric materials, e.g., with K<3.9.

Figure 3:
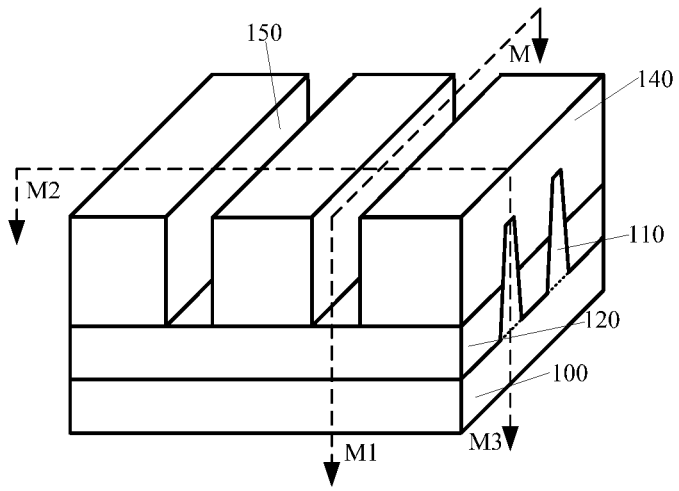
Figure 4:
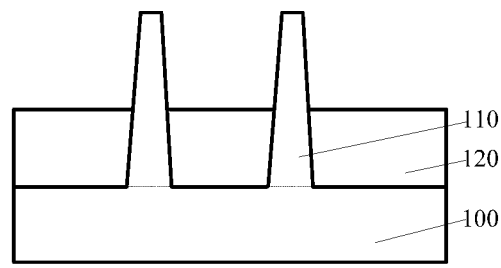
Figure 5:
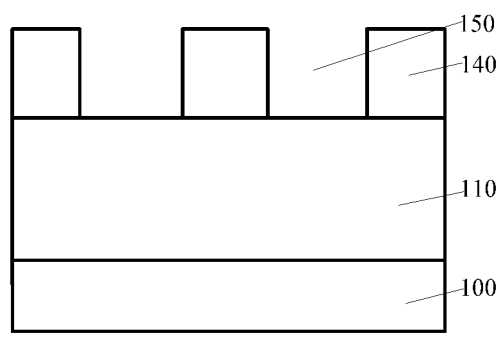

FIG. 3 is based on FIG. 1. FIG. 4 is the cross-sectional view along the M-M1 direction in FIG. 3 and FIG. 5 is the cross-sectional view along the M2-M3 direction in FIG. 3. Referring to FIGS. 3-5, the dummy gate structures 130 may be removed to form the openings 150 in the interlayer dielectric layer 140.

The openings 150 may expose a portion of the sidewalls and a portion of the top surfaces of the fins 110.

The dummy gate structures 130 may be removed by a wet etching process, a dry etching process or a combination thereof.

The subsequent process may further include forming a target work function layer on the bottom and the sidewalls of each opening 150. Each target work function layer may include a first target region, covering the first sidewall regions, and a second target region, covering the second sidewall regions. The second target region and a third portion of the target work function layer on the top surface of each fin 110 may be doped with modification ions. The first target region of the target work function layer may have a first effective work function value, while the second target region of the target work function layer and the third portion of the target work function layer on the top surface of each fin may have a second effective work function value. The first effective work function value may be smaller than the second effective work function value.

Figure 6:
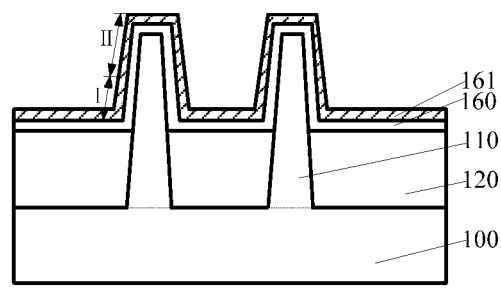
Figure 7:
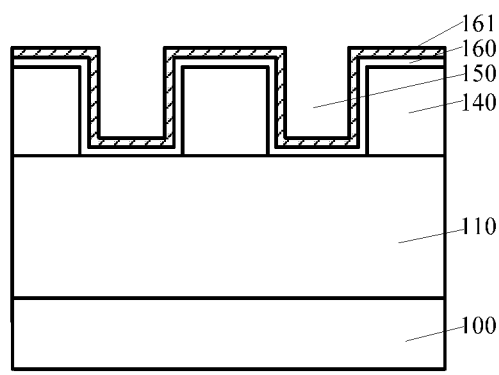

FIG. 6 is based on in FIG. 4, and FIG. 7 is based on FIG. 5. Referring to FIGS. 6-7, an initial work function layer 161 may be formed on the bottom and on the sidewalls of each opening 150 (e.g., in Step S806 in FIG. 10). The initial work function layer 161 may include a first initial region I covering the first sidewall region and a second initial region II covering the second sidewall region. The initial work function layer 161 may have the first effective work function value. A ratio of the size of the first initial region I over the size of the second initial region II along a direction parallel to the sidewalls of the fins 110 and perpendicular to the extending direction of the fins 110 may be about 2:5 to about 3:5.

In one embodiment, a gate dielectric layer 160 may be formed on the bottom and sidewalls of each opening 150 before forming the initial work function layers 161. Correspondingly, the initial work function layer 160 may be formed on each gate dielectric layer 160.

The gate dielectric layer 160 may be made of a high-K dielectric material, e.g., a material with K>3.9, including $HfO_2$, $La_2O_3$, HfSiON, $HfAlO_2$, $ZrO_2$, $Al_2O_3$, $La_2O_3$, and/or $HfSiO_4$.

The gate dielectric layer 160 may also be formed on the interlayer dielectric layer 140.

The gate dielectric layer 160 may be formed by a deposition method, such as a plasma-enhanced chemical vapour deposition method, an atomic layer deposition method, a sub-atmospheric chemical vapour deposition method or a low-pressure chemical vapour deposition method.

The initial work function layer 161 may also be formed on the interlayer dielectric layer 140.

The initial work function layer 161 may be formed by a deposition method, such as a plasma-enhanced chemical vapour deposition method, an atomic layer deposition method, a sub-atmospheric chemical vapour deposition method or a low-pressure chemical vapour deposition method.

When the FinFET device is P-type, the initial work function layer 161 may be made of a P-type work function material, including TiN, TiC, and/or MoN.

When the FinFET device is N-type, the initial work function layer 161 may be made of an N-type work function material, including TiAl and/or TaAl.

In one embodiment, the initial work function layers 161 may have a thickness of about 5 Å to about 40 Å.

Figure 8:
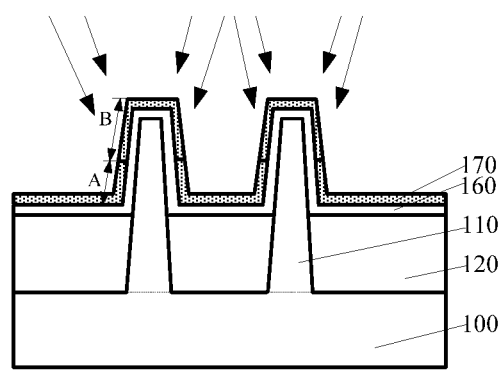
Figure 9:
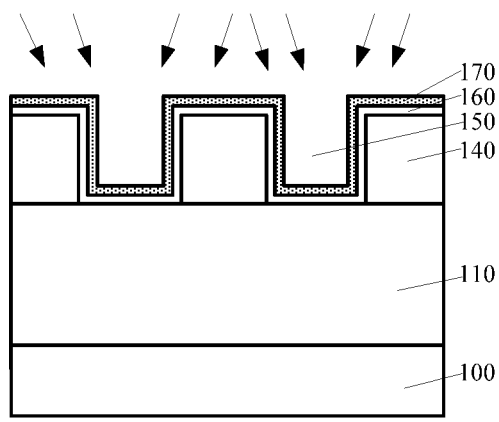
Figure 10:
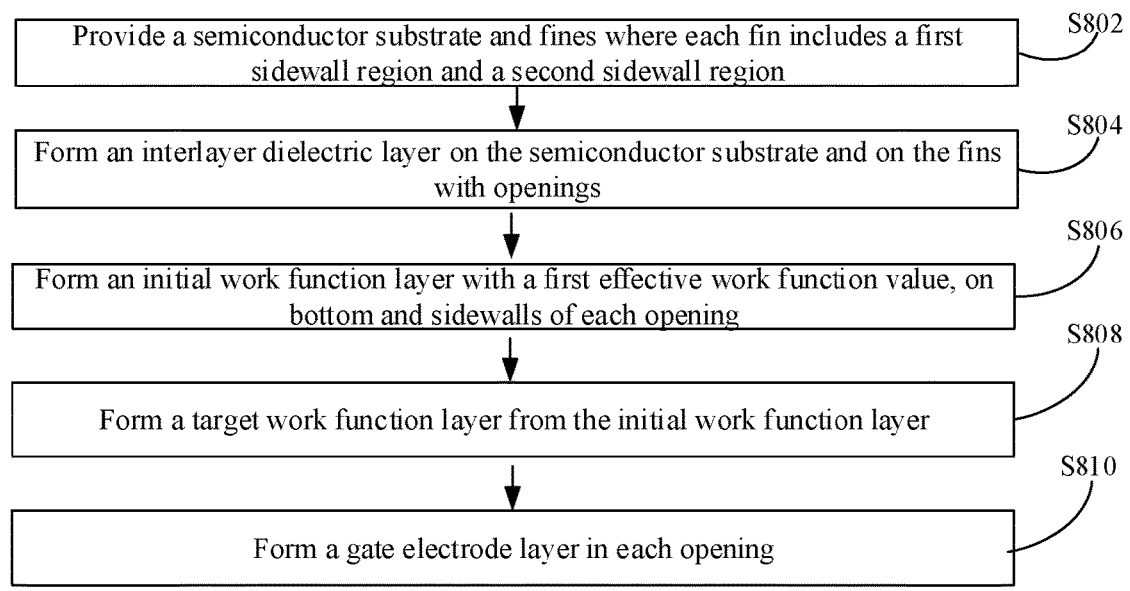
FIG. 10 illustrates an exemplary method for forming a FinFET device according to various disclosed embodiments.

FIG. 8 is based on FIG. 6, and FIG. 9 is based on in FIG. 7. The modification ions may be implanted into the second initial region II of the initial work function layer 161 and a third portion of the initial work function layer 161 on the top surface of each fin 110 by an ion implantation process, to form a target work function layer 170 from the initial work function layer 161 (e.g. in Step S808 in FIG. 10). The first initial region I of the initial work function layer 161 may form the first target region A of the target work function layer 170, and the second initial region II of the initial work function layer 161 may form the second target region B of the target work function layer 170.

A ratio of a size of the first target region A over the size of the second target region B along a direction parallel to the sidewalls of each fin 110 and perpendicular to the extending direction of each fin 110 may be about 2:5 to about 3:5.

The first target region A of the target work function layer 170 may have a first effective work function value, while the second target region B of each target work function layer 170 and a third portion of the target work function layer 170 on the top surface of each fin 110 may have a second effective work function value. The first effective work function value may be smaller than the second effective work function value.

If the initial work function layer 161 is made of a P-type work function material, the second initial region II of the initial work function layer 161 and the third portion of the initial work function layer 161 may change from a polycrystalline structure to an amorphous structure, after the ion implantation process. Correspondingly, the second target region B of the target work function layer 170 and the third portion of the target work function layer 170 may have an amorphous structure, or the second target region B of the target work function layer 170 and the third portion of the target work function layer 170 may have a higher amorphous degree than the initial work function layer 161, after the ion implantation process. The second target region B of the target work function layer 170 may have a lower Fermi energy level and higher work function than the initial work function layer 161. Ultimately, the effective work function value of the second target region B of the target work function layer 170 may be higher the initial work function layer 161.

If the initial work function layer 161 is made of N-type work function materials, recipient levels may be introduced in the second initial region II of the initial work function layer 161 and the third portion of the initial work function layer 161, after the ion implantation process. Correspondingly, the second target region B of the target work function layer 170 may have a lower Fermi energy level and higher work function than the initial work function layer 161. Ultimately, the effective work function value of the second target region B of the target work function layer 170 may be higher the initial work function layer 161.

If the formed FinFET device is P-type, the first target region A of the target work function layer 170 may be made of a material including TiN, TiC, and/or MoN, and the second target region B of the target work function layer 170 may be made of a material including TiN, TiC and/or MoN, doped with modification ions.

If the formed FinFET device is N-type, the first target region A of the target work function layer 170 may be made of a material including TiAl and/or TaAl, and the second target region B of the target work function layer 170 may be made of a material including TiAl and or TaAl, doped with modification ions.

If the initial work function layer 161 is made of TiN, TiC or MoN, the modification ions may be N ions, F ions, C ions or As ions.

If the initial work function layer 161 is made of TiAl or TaAl, the modification ions may be Al ions or Ga ions.

If an implantation energy in the ion implantation process is too large, a large portion of the modification ions will penetrate the second initial region II and the third portion of the initial work function layer 161, and subsequently may enter the fins 110; if the implantation energy in the ion implantation process is too small, the modification ions could not be effectively implanted in the second initial region II and the third portion of the initial work function layer 161. Further, different kinds of the modification ions may have different atomic mass. Correspondingly, if the implantation depth is same, the modification ions with larger atomic mass may dissipate a larger energy and then require higher implantation energy.

If an implantation dose of the ion implantation process is too large, a large portion of the process will be waste. If the implantation dose of the ion implantation process is too small, the concentration of the modification ions in the second target region B and the third portion of the target work function layer 170 may be too low.

Further, the ion implantation process has an implantation direction. The angle between the implantation direction and the normal of the surface of the semiconductor substrate 100 will be referred to as a first implantation angle, and the angle between the implantation direction and the extending direction of the fins 110 will be referred to as a second implantation angle. If the implantation depth is same, the higher implantation energy may require a smaller second implantation angle.

The first implantation angle may be used to adjust the ion implantation process for implanting the modification ions into the second initial region II. Correspondingly, a portion of the modification ions may be blocked by the interlayer dielectric layer 140 and may not be implanted in the first initial region I.

In one embodiment, in the ion implantation process, the modification ions are N ions; the implantation energy is about 2.5 keV to about 4.5 keV; the implantation dose is about 1E13 atom/cm$^2$ to about 1E15 atom/cm$^2$; the first implantation angle is about 10 degrees to about 40 degrees, and the second implantation angle is about 0 degree to about 15 degrees.

In another embodiment, in the ion implantation process, the modification ions are F ions; the implantation energy is about 3 keV to about 5 keV; the implantation dose is about 1E13 atom/cm$^2$ to about 1E15 atom/cm$^2$; the first implantation angle is about 10 degrees to about 40 degrees, and the second implantation angle is about 0 degree to about 15 degrees.

In another embodiment, in the ion implantation process, the modification ions are C ions; the implantation energy is about 2 keV to about 4 keV; the implantation dose is about 1E13 atom/cm$^2$ to about 1E15 atom/cm$^2$; the first implantation angle is about 10 degrees to about 40 degrees, and the second implantation angle is about 0 degree to about 15 degrees.

In another embodiment, in the ion implantation process, the modification ions are As ions; the implantation energy is about 8 keV to about 11 keV; the implantation dose is about 1E13 atom/cm$^2$ to about 1E15 atom/cm$^2$; the first implantation angle is about 10 degrees to about 40 degrees, and the second implantation angle is about 0 degree to about 15 degrees.

In modification ions, As ions have larger atomic mass than F ions, and F ions have larger atomic mass than N ions, while N ions have larger atomic mass than C ions. Correspondingly, the implantation energy of As ions may be larger than F ions, and the implantation energy of F ions may be larger than N ions, while the implantation energy of N ions may be larger than C ions.

In one embodiment, in the ion implantation process, the modification ions are Al ions; the implantation energy is about 6 keV to about 8 keV; the implantation dose is about 1E13 atom/cm$^2$ to about 1E15 atom/cm$^2$; the first implantation angle is about 10 degrees to about 40 degrees, and the second implantation angle is about 0 degree to about 15 degrees.

In another embodiment, in the ion implantation process, the modification ions are Ga ions; the implantation energy is about 7 keV to about 10 keV; the implantation dose is about 1E13 atom/cm$^2$ to about 1E15 atom/cm$^2$; the first implantation angle is about 10 degrees to about 40 degrees, and the second implantation angle is about 0 degree to about 15 degrees.

In above modification ions, Ga ions have larger atomic mass than Al ions, and the implantation energy of Ga ions may be larger than Al ions correspondingly.

The modifying process may further include an annealing treatment after the ion implantation process.

The annealing treatment may be used to make the distribution of the modification ions more homogenous.

A gate electrode layer may be formed in each opening 150 after forming the target work function layer 170 (e.g., in Step S810 in FIG. 10).

The gate electrode layer may be made of a metal including Cu and/or W.

The gate electrode layer may also be formed on the interlayer dielectric layer 140.

The gate electrode layer may be formed by a deposition method, such as a plasma-enhanced chemical vapour deposition method, an atomic layer deposition method, a sub-atmospheric chemical vapour deposition method or a low-pressure chemical vapour deposition method.

In one embodiment, the process may further include planarizing the gate electrode layer, the target work function layer 170 and gate dielectric layer 160, to expose the top surface of the interlayer dielectric layer 140.

In various embodiments of the present disclosure, the first effective work function value may be smaller than the second effective work function, and the turn-on voltage of the middle/bottom region of the fins 110 may be increased because of the small first effective work function value. Correspondingly, the off-state leakage current may be suppressed because the large turn-on voltage can suppress the off-state leakage current and the off-state leakage current of a FinFET device may mainly be located in the middle/bottom region of the fins 110. In the meantime, the turn-on voltage of the middle/top region of the fins 110 may be decreased because of the large second effective work function value. When the driving voltage is constant, a small turn-on voltage can increase the driving current. Then the driving current of the FinFET device mainly locating in the middle-top region of the fins 110 may be increased, and ultimately the performance of the FinFET device may be improved.

Various embodiments also provide a FinFET device as shown in FIG. 8 and FIG. 9. The FinFET device may include: a semiconductor substrate 100; discrete fins 110 protruding from the semiconductor substrate 100 where each fin includes a first sidewall region and a second sidewall region above the first sidewall region; an interlayer dielectric layer 140 on the semiconductor substrate 100 and on the fins 110, where the interlayer dielectric layer 140 may have openings 150 to expose a portion of sidewalls and a portion of top surfaces of the fins 110; and a target work function layer 170 on the bottom and the sidewalls of each opening 150. The target work function layer 170 may include a first target region A covering the first sidewall region, a second target region B covering the second sidewall region, and a third portion of the target work function layer 170 the top surface of each fin. The second target region B and the third portion of the target work function layer 170 may be doped with modification ions. The first target region A of the target work function layer 170 may have a first effective work function value, while the second target region B and the third portion of the target work function layer 170 may have a second effective work function value. The first effective work function value may be smaller than the second effective work function value.

The materials of the semiconductor substrate, the materials and positions of the fins, and the materials of the interlayer dielectric layer 140, can refer to previous descriptions.

A ratio of the size of the first target region A over the size of the second target region B along a direction parallel to the sidewalls of each fin 110 and perpendicular to the extending direction of the fins 110 may be about 2:5 to about 3:5.

When the formed FinFET device is P-type, the first target region A of the target work function layer 170 may be made of a material including TiN, TiC, and/or MoN, and the second target region B of the target work function layer 170 may be made of a material including TiN, TiC and/or MoN, and the second target region B may be doped with modification ions.

When the formed FinFET device is N-type, the first target region A of the target work function layer 170 may be made of a material including TiAl and/or TaAl, and the second target region B of the target work function layer 170 may be made of a material including TiAl and/or TaAl, and the second target region B may be doped with modification ions.

In the present disclosure, a P-type work function layer and an N-type work function layer may be determined as below.

The P-type work function layer may be used to adjust a threshold voltage of the P-type transistor, and the N-type work function layer may be used to adjust a threshold voltage of the N-type transistor.

A PMOS transistor may be provided and the PMOS transistor may include: a first semiconductor substrate, a first gate dielectric layer on the first semiconductor substrate and being made of a high-K material, a first functional layer on the first gate dielectric layer, a first gate electrode layer on the first functional layer.

A first work function layer to be determined may be formed between the first gate dielectric layer and the first functional layer, and on the surface of the first gate dielectric layer. The first work function layer to be determined may have a first preset thickness.

The effective work function value of the PMOS transistor may be measured. If the effective work function value of the PMOS transistor is in a first range, the first work function layer to be determined may be a P-type work function layer.

In one embodiment, the first preset thickness may be about 5 Å to about 60 Å, and the first range may be about 4.6 eV to about 5.2 eV.

An NMOS transistor may be provided and the NMOS transistor may include: a second semiconductor substrate, a second gate dielectric layer on the second semiconductor substrate and being made of a high-K material, a second functional layer on the second gate dielectric layer, a second gate electrode layer on the second functional layer.

A second work function layer to be determined may be formed between the second gate dielectric layer and the second functional layer, and on the surface of the second gate dielectric layer. The second work function layer to be determined may have a second preset thickness.

The effective work function value of the NMOS transistor may be measured. If the effective work function value of the NMOS transistor is in a second range, the second work function layer to be determined may be an N-type work function layer.

In one embodiment, the second preset thickness may be about 5 Å to about 60 Å, and the second range may be about 4.0 eV to about 4.5 eV.

In the methods for forming FinFETs provided by various embodiments of the present disclosure, a target work function layer may be formed on sidewalls and on a bottom of each opening. The target work function layer may include a first target region covering the first sidewall region, a second target region covering the second sidewall region, and a third portion on the top surface of each fin. The second target region and the third portion of the target work function layer is doped with modification ions. The first target region of the target work function layer has a first effective work function value, while the second target region and the third portion of the target work function layer has a second effective work function value greater than the first effective work function value. The turn-on voltage of the middle/bottom region of the fins may be increased because of the small first effective work function value. Correspondingly, the off-state leakage current may be suppressed because the large turn-on voltage can suppress the off-state leakage current and the off-state leakage current of a FinFET device may mainly be located in the middle/bottom region of the fins. In the meantime, the turn-on voltage of the middle/top region of the fins may be decreased because of the large second effective work function value. When the driving voltage is constant, a small turn-on voltage can increase the driving current. Then the driving current of the FinFET device mainly locating in the middle-top region of the fins may be increased. Ultimately the performance of the FinFET device may be improved.

In FinFETs provided by various embodiments of the present disclosure, the second effective work function of the second target region and the third portion of the target work function layer may be greater than the first effective work function value of the first target region of the target work function layer. The turn-on voltage of the middle/bottom region of the fins may be increased because of the small first effective work function value. Correspondingly, the off-state leakage current may be suppressed because the large turn-on voltage can suppress the off-state leakage current and the off-state leakage current of a FinFET device may mainly be located in the middle/bottom region of the fins. In the meantime, the turn-on voltage of the middle/top region of the fins may be decreased because of the large second effective work function value. When the driving voltage is constant, a small turn-on voltage can increase the driving current. Then the driving current of the FinFET device mainly locating in the middle-top region of the fins may be increased. Ultimately the performance of the FinFET device may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method for a FinFET, comprising:
providing a semiconductor substrate and fins on the semiconductor substrate, wherein each fin includes a first sidewall region and a second sidewall region above the first sidewall region;
forming an interlayer dielectric layer on the semiconductor substrate and on the fins, with openings in the interlayer dielectric layer to expose a portion of sidewalls and a portion of a top surface of each fin; and
forming a target work function layer on sidewalls and on a bottom of each opening, the target work function layer including a first target region covering the first sidewall region, a second target region covering the second sidewall region, and a third portion on the top surface of each fin, wherein:
the second target region and the third portion of the target work function layer are doped with modification ions and above the first target region; and
the first target region of the target work function layer has a first effective work function value, while the second target region and the third portion of the target work function layer has a second effective work function value greater than the first effective work function value.

2. The fabrication method according to claim 1, wherein, when the FinFET device is P-type,
the first target region of the target work function layer is made of a material including TiN, TiC, and/or MoN, and
the second target region of the target work function layer is made of a material including TiN, TiC and/or MoN, and the second target region is doped with the modification ions.

3. The fabrication method according to claim 1, wherein, when the FinFET device is N-type,
the first target region of the target work function layer is made of a material including TiAl and/or TaAl, and
the second target region of the target work function layer is made of a material including TiAl and/or TaAl, and the second target region is doped with the modification ions.

4. The fabrication method according to claim 1, wherein each fin has a bottom width greater than a top width.

5. The fabrication method according to claim 4, wherein a ratio of a size of the first sidewall region over a size of the second sidewall region of a same sidewall of each fin in a direction parallel to the sidewalls of the fins and perpendicular to an extending direction of the fins is about 2:5 to about 3:5.

6. A fabrication method for a FinFET, comprising:
providing a semiconductor substrate and fins on the semiconductor substrate, wherein each fin includes a first sidewall region and a second sidewall region above the first sidewall region;
forming an interlayer dielectric layer on the semiconductor substrate and on the fins, with openings in the interlayer dielectric layer to expose a portion of sidewalls and a portion of a top surface of each fin; and
forming a target work function layer on sidewalls and on a bottom of each opening, the target work function layer including a first target region covering the first sidewall region, a second target region covering the second sidewall region, and a third portion on the top surface of each fin, wherein:
the second target region and the third portion of the target work function layer is doped with modification ions;
the first target region of the target work function layer has a first effective work function value, while the second target region and the third portion of the target work function layer has a second effective work function value greater than the first effective work function value; and
the target work function layer is formed by:
forming an initial work function layer with a first effective work function value on the sidewalls and the bottom of each opening, wherein the initial work function layer includes a first initial region covering the first sidewall region and a second initial region covering the second sidewall region of each fin; and
implanting the modification ions into the second initial region of the initial work function layer and into a third portion of the initial work function layer on the top surface of each fin using an ion implantation process, to form the target work function layer; wherein:
the first initial region of the initial work function layer forms the first target region of the target work function layer, and the second initial region of the initial work function layer forms the second target region of the target work function layer.

7. The fabrication method according to claim 6, wherein:
the initial work function layer is made of a material including TiAl and/or TaAl; and
the modification ions are Al ions or Ga ions.

8. The fabrication method according to claim 7, wherein the ion implantation process uses:
the modification ions of Al ions;
the implantation energy of about 6 keV to about 8 keV;
the implantation dose of about 1E13 atom/cm' to about 1E15 atom/cm$^2$;
the first implantation angle of about 10 degrees to about 40 degrees, and
the second implantation angle of about 0 degree to about 15 degrees.

9. The fabrication method according to claim 7, wherein the ion implantation process uses:
the modification ions of Ga ions;
the implantation energy of about 7 keV to about 10 keV;
the implantation dose of about 1E13 atom/cm$^2$ to about 1E15 atom/cm$^2$;
the first implantation angle of about 10 degrees to about 40 degrees, and
the second implantation angle of about 0 degree to about 15 degrees.

10. The fabrication method according to claim 6, wherein:
the initial work function layer is made of a material including TiN, TiC, and/or MoN, and
the modification ions include N ions, F ions, C ions, As ions, or a combination thereof.

11. The fabrication method according to claim 10, wherein the ion implantation process uses:
the modification ions of N ions;
an implantation energy of about 2.5 keV to about 4.5 keV;
an implantation dose of about 1E13 atom/cm$^2$ to about 1E15 atom/cm$^2$;
a first implantation angle of about 10 degrees to about 40 degrees, and
a second implantation angle of about 0 degree to about 15 degrees,
wherein the first implantation angle is an angle between an implantation direction and a normal direction of a surface of the semiconductor substrate, and the second implantation angle is an angle between the implantation direction and an extending direction of the fins.

12. The fabrication method according to claim 10, wherein the ion implantation process uses:
the modification ions of F ions;
the implantation energy of about 3 keV to about 5 keV;
the implantation dose of about 1E13 atom/cm$^2$ to about 1E15 atom/cm$^2$;
the first implantation angle of about 10 degrees to about 40 degrees, and
the second implantation angle of about 0 degree to about 15 degrees.

13. The fabrication method according to claim 10, wherein the ion implantation process uses:
the modification ions of carbon ions;
the implantation energy of about 2 keV to about 4 keV;
the implantation dose of about 1E13 atom/cm' to about 1E15 atom/cm$^2$;
the first implantation angle of about 10 degrees to about 40 degrees, and
the second implantation angle of about 0 degree to about 15 degrees.

14. The fabrication method according to claim 10, wherein the ion implantation process uses:
the modification ions of As ions;
the implantation energy of about 8 keV to about 11 keV;
the implantation dose of about 1E13 atom/cm$^2$ to about 1E15 atom/cm$^2$;
the first implantation angle of about 10 degrees to about 40 degrees, and
the second implantation angle of about 0 degree to about 15 degrees.

15. A FinFET device, comprising:
a semiconductor substrate;
fins on the semiconductor substrate, wherein each fin has a first sidewall region and a second sidewall region above the first sidewall region;
an interlayer dielectric layer on the semiconductor substrate and on the fins, containing openings to expose a portion of sidewalls and a portion of the top surface of each fin; and
a target work function layer on sidewalls and a bottom of each opening, wherein:
the target work function layer includes a first target region covering the first sidewall region, a second target region covering the second sidewall region, and a third portion on the top surface of each fin;
the second target region and the third portion of the target work function layer on the top surface of each fin are doped with modification ions and above the first target region; and
the first target region of the target work function layer has a first effective work function value, while the second target region and the third portion of the target work function layer has a second effective work function value greater than the first effective work function value.

16. The FinFET according to claim 15, wherein each fin has a bottom width greater than a top width.

17. The FinFET according to claim 15, wherein a ratio of a size of the first sidewall region over a size of the second sidewall region of a same sidewall of each fin in a direction parallel to the sidewalls of the fins and perpendicular to an extending direction of the fins is about 2:5 to about 3:5.

18. The FinFET according to claim 15, wherein, when the FinFET device is P-type,
the first target region of the target work function layer is made of a material including TiN, TiC, and/or MoN, and
the second target region of the target work function layer is made of a material including TiN, TiC and/or MoN, and the second target region is doped with the modification ions.

19. The FinFET according to claim 15, wherein, when the FinFET device is N-type,
the first target region of the target work function layer is made of a material including TiAl and/or TaAl, and
the second target region of the target work function layer is made of a material including TiAl and/or TaAl, and the second target region is doped with the modification ions.

* * * * *